`US009319048B2`

(12) United States Patent
Lifshitz

(10) Patent No.: US 9,319,048 B2
(45) Date of Patent: Apr. 19, 2016

(54) CLOCK DIVIDER

(71) Applicant: MARVELL WORLD TRADE LTD, St. Michael (BB)

(72) Inventor: Elad Lifshitz, Shaarei Tikva (IL)

(73) Assignee: Marvell World Trade Ltd., St. Michael (BM)

( * ) Notice: Subject to any disclaimer, the term of this patent is extended or adjusted under 35 U.S.C. 154(b) by 0 days.

(21) Appl. No.: 14/608,333

(22) Filed: Jan. 29, 2015

(65) Prior Publication Data

US 2015/0214954 A1 Jul. 30, 2015

Related U.S. Application Data

(60) Provisional application No. 61/933,127, filed on Jan. 29, 2014, provisional application No. 62/012,919, filed on Jun. 16, 2014.

(51) Int. Cl.
| | |
|---|---|
| *H03K 21/02* | (2006.01) |
| *H03K 19/08* | (2006.01) |
| *H03K 19/21* | (2006.01) |
| *H03K 5/19* | (2006.01) |

(52) U.S. Cl.
CPC .............. *H03K 21/026* (2013.01); *H03K 5/19* (2013.01); *H03K 19/08* (2013.01); *H03K 19/21* (2013.01)

(58) Field of Classification Search
CPC ..... H03K 23/68; H03K 21/023; H03K 21/10; H03K 23/667; H03K 21/00; H03K 21/026
See application file for complete search history.

(56) References Cited

U.S. PATENT DOCUMENTS

| | | | |
|---|---|---|---|
| 7,525,341 B1 | 4/2009 | Rosen et al. | |
| 7,652,516 B2 | 1/2010 | Bourstein et al. | |
| 7,801,263 B2 | 9/2010 | Haimzon | |
| 7,808,271 B2 | 10/2010 | Rosen et al. | |
| 2004/0036513 A1* | 2/2004 | Gibbons | H03K 23/667 327/117 |

* cited by examiner

*Primary Examiner* — Jany Richardson

(57) ABSTRACT

Aspects of the disclosure provide a circuit including a logic circuit. The logic circuit is configured to operate without inputs from a first clock signal. The logic circuit is further configured to frequency-divide the first clock signal to generate a second clock signal based on a logic combination of a first pattern provided by a first circuitry driven by the first clock signal, and a second pattern provided by a second circuitry driven by the first clock signal.

12 Claims, 3 Drawing Sheets

CLOCK DIVIDER

INCORPORATION BY REFERENCE

This present disclosure claims the benefit of U.S. Provisional Application No. 61/933,127, "Middle Point Clock Divider" filed on Jan. 29, 2014, and U.S. Provisional Application No. 62/012,919, "Middle Point Clock Divider" filed on Jun. 16, 2014, which are incorporated herein by reference in their entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, synchronous circuits operate in response to one or more clock signals. In an example, an integrated circuit (IC) chip includes a central processing unit (CPU) that functions at a first frequency and an interface data bus circuit that functions at a second frequency that is a fraction of the first frequency. The IC chip includes a clock divider to frequency-divide a first clock signal to generate a second clock signal. The first clock signal is provided to the CPU and the second clock signal is provided to the interface data bus to synchronize the operations of the CPU and the interface data bus.

SUMMARY

Aspects of the disclosure provide a circuit including a logic circuit. The logic circuit is configured to operate without inputs from a first clock signal. The logic circuit is further configured to frequency-divide the first clock signal to generate a second clock signal based on a logic combination of a first pattern provided by a first circuitry driven by the first clock signal, and a second pattern provided by a second circuitry driven by the first clock signal.

In an embodiment, the first circuitry includes a first sampling flip-flop driven by the first clock signal, and the second circuit includes a second sampling flip-flop driven by an inversed first clock signal. In an example, the first sampling flip-flop and the second sampling flip-flop have a substantially equal delay in response input clocks. Further, in the example, the circuit includes a first inverter configured to inverse the first clock signal to generate the inversed first clock signal, and the first circuitry includes a second inverter configured to compensate for a delay of the first inverter.

According to an aspect of the disclosure, the first sampling flip-flop is configured to drive the first pattern in response to rising edges of the first clock signal and the second sampling flip-flop is configured to drive the second pattern in response to falling edges of the clock signal.

In an embodiment, the logic circuit includes a logic gate to provide the second clock signal with a substantially equal delay in response to the first pattern and the second pattern. In an example, the logic circuit includes at least one of a NAND gate, a NOR gate, a XOR gate, a XNOR gate.

Aspects of the disclosure provide a method for clock generation. The method includes receiving a first pattern provided by a first circuitry driven by a first clock signal, receiving a second pattern provided by a second circuitry driven by the first clock signal, and logic-combining, using a logic circuit that is configured to operate without receiving an input from the first clock signal, the first pattern and the second pattern to frequency-divide the first clock signal to generate a second clock signal.

Aspects of the disclosure provide an integrated circuit (IC) chip. The IC chip includes a clock generator and a clock divider. The clock generator is configured to generate a first clock signal. The clock divider includes a first circuitry configured to drive a first pattern in response to the first clock signal, a second circuitry configured to drive a second pattern in response to the first clock signal and a logic circuit configured to operate without inputs from the first clock signal, and to frequency-divide the first clock signal to generate a second clock signal based on a logic combination of the first pattern and the second pattern.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
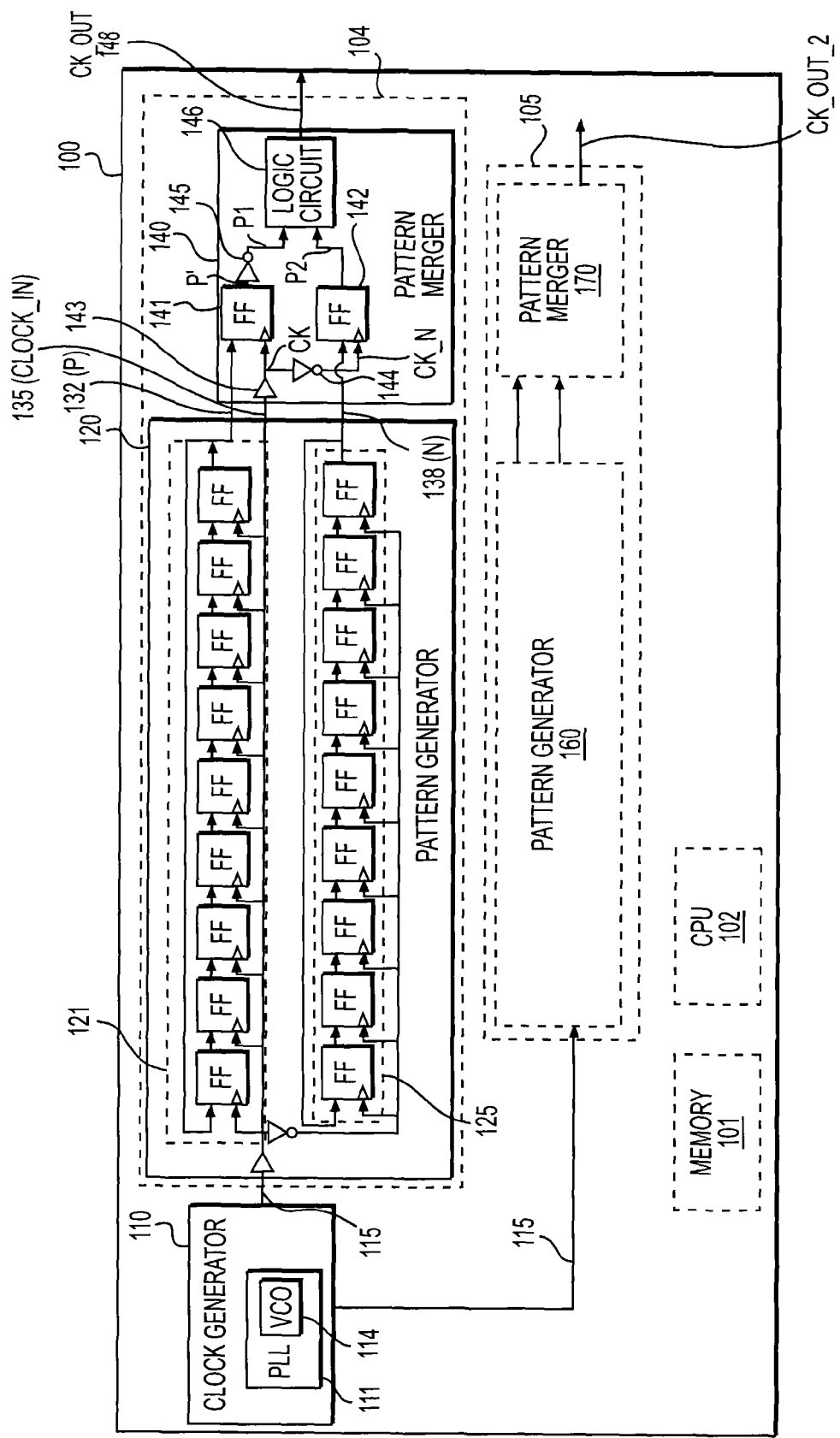
FIG. 1 shows a block diagram of a circuit 100 according to an embodiment of the disclosure.

FIG. 1 shows a block diagram of an integrated circuit (IC) chip 100 according to an embodiment of the disclosure. The IC chip 100 includes a clock divider 104 configured to frequency-divide a first clock signal 115 to generate and output a second clock signal 148. In an embodiment, the clock divider 104 is a middle point clock divider configured to be able to use a non-integer divider, such as an integer and a half (middle point). In an embodiment, the second clock signal 148 is a balanced clock that has about equal durations at both high and low levels, i.e., about 50% duty cycle. In addition, in an example, the second clock signal 148 has a substantially equal slope for rising edge transitions and falling edge transitions.

The IC chip 100 can be any suitable IC chip that operates based on one or more clock signals. In an example, the IC chip 100 includes circuit blocks, such as a memory 101, a central processing unit (CPU) 102, and the like that require clocks of different frequencies. The IC chip 100 includes clock dividers, such as clock dividers 104 and 105, and the like, to frequency-divide the same first clock signal 115 by different numbers to generate the required clocks, such as clock signals CK_OUT and CK_OUT_2, of the different frequencies. The clocks of the different frequencies are respectively provided to the corresponding circuit blocks, such as for example the clock signal CK_OUT is provided to the memory 101 and the clock signal CK_OUT_2 is provided to the CPU 102. It is noted that, in an example, one or more of the generated clocks are provided to circuits that are external to the IC chip 100.

In the FIG. 1 example, the first clock signal 115 is generated on-chip by a clock generator 110. It is noted that the clock generator 110 can use any suitable technique, such as a phase-locked loop (PLL), a digital PLL, a ring oscillator, and the like, to generate the first clock signal 115. In the FIG. 1 example, the clock generator 110 uses a phase-locked loop (PLL) 111 to generate the first clock signal 115. It is noted that, in another example, the first clock signal 115 is generated by a clock generator (not shown) that is external to the IC chip 100 and then is input to the IC chip 100.

According to an aspect of the disclosure, the clock divider 104 is configured to use a logic circuit 146 to logically combine two patterns associated with the frequency-divisor in order to generate the second clock signal 148. The logic circuit 146 does not operate based on, nor is it driven by, the first clock signal 115. For example, the logic circuit 146 is a two-input logic circuit that receives patterns P1 and P2 as two inputs, and logically combines the two inputs to generate the second clock signal 148. The logic circuit 146 does not receive the first clock signal 115 as an input. In addition, the clock divider 104 is a middle point divider in which the frequency-divisor can be an integer, such as 2, 3, 10, 11, and the like, or can be a half-integer, such as two and a half, four and a half, five and a half, and the like. In an example, the clock divider 104 is configured to use a half-integer to allow the clock divider 104 to generate the second clock signal 148 based on the first clock signal 115 that has a reduced frequency.

For example, to generate a second clock signal 148 of 400 MHz, in a first implementation, the clock divider 104 is configured to frequency-divide a first clock signal 115 of 2,000 MHz by five; and in a second implementation, the clock divider 104 is configured to frequency-divide a first clock signal 115 of 1,000 MHz by two and half. According to an aspect of the disclosure, the clock generator 110 consumes less power to generate the first clock signal 115 with reduced frequency. In an example, the PLL 111 uses a voltage-controlled oscillator (VCO) 114 to generate the first clock signal 115. The VCO 114 consumes much less power in the second implementation that generates the first clock signal 115 with a reduced frequency.

In the FIG. 1 example, specifically, the clock divider 104 includes a pattern generator 120 and a pattern merger 140. The pattern generator 120 can use any suitable technique to generate two patterns associated with the frequency divisor. In an example, one of the two patterns is generated to define rising edge positions of the second clock signal 148 and is referred to as a positive pattern, and the other pattern is generated to define falling edge positions of the second clock signal 148 and is referred to as a negative pattern, such as disclosed in Assignee's U.S. Pat. No. 7,652,516, issued on Jan. 26, 2010, which is incorporated herein by reference in its entirety.

In the FIG. 1 example, the pattern generator 120 includes a first plurality of flip-flops connected in serial to form a first loop 121, and a second plurality of flip-flops connected in serial to form a second loop 125. In an example, the first plurality of flip-flops is initialized with binary bits pre-determined for the positive pattern and the second plurality of flip-flops is initialized with binary bits pre-determined for the negative pattern. When the first plurality of flip-flops is clocked, for example, based on the first clock signal 115, the flip-flops in the first loop 121 shift the binary bits and generate the positive pattern (P) 132. When the second plurality of flip-flops is clocked, for example, based on an inverse of the first clock signal 115, the flip-flops in the second loop 125 shift the binary bits and generate the negative pattern (N) 138.

It is noted that the number of flip-flops and the initial binary bits are associated with the frequency divisor. In an example, to generate the positive pattern and the negative pattern associated with four and a half, the first loop 121 includes nine flip-flops that are initialized with binary bits "110000000", and the second loop 125 includes nine flip-flops that are initialized with binary bits "111110011" in an example.

Further, in the FIG. 1 example, the pattern merger 140 includes a first flip-flop 141, a second flip-flop 142, a buffer 143, a first inverter 144, a second inverter 145, and the logic circuit 146. These elements are coupled together as shown in FIG. 1. In the FIG. 1 example, the first clock signal 115 is suitably buffered, for example, by one or more buffers, and is provided to the pattern merger 146 as an input clock signal (CLOCK_IN) 135. The buffer 143 in the pattern merger 140 receives the input clock signal 135, and provides a clock signal CK to the first flip-flop 141.

Specifically, in the embodiment seen in FIG. 1, the first flip-flop 141 receives the positive pattern 132, samples and buffers the positive pattern 132 in response to rising edges of the clock signal CK, and outputs buffered positive pattern (P'). The second inverter 145 then inverses the buffered positive pattern (P') to generate a first pattern P1, that is inverted relative to positive pattern P', and provides the first pattern P1 to the logic circuit 146. The second inverter 145 is suitably configured to align the first pattern P1 and the second pattern P2 for example with respect to the input clock signal CLOCK_IN 135.

The first inverter 144 inverses the clock signal CK to generate an inversed clock signal CK_N, and provides the inversed clock signal CK_N to the second flip-flop 142. The second flip-flop 142 receives the negative pattern 138, samples and buffers the negative pattern in response to rising edges of the inversed clock signal CK_N, outputs the buffered negative pattern as a second pattern P2, which as seen in the example of FIG. 1 is not inverted, and provides the second pattern P2 to the logic circuit 146. It is noted that the rising edges of the inversed clock signal CK_N correspond to falling edges of the clock signal CK, in the embodiment.

The logic circuit 146 receives the first pattern P1 and the second pattern P2, and logically combines the first pattern P1 and the second pattern P2 to generate the second clock signal (CK_OUT) 148. The logic circuit 146 can include any suitable logic gate, such as NAND gate, NOR gate, XOR gate, XNOR gate, and the like in various different embodiments as long as the logic gate is symmetry logic gate that has substantially equal delay with respect to inputs.

According to an aspect of the disclosure, the pattern merger 140 has a first delay path that starts from the clock signal CK, and sequentially includes the first flip-flop 141 that operates in response to the clock signal CK, the second inverter 145 and the logic circuit 146, and has a second delay path that starts at the clock signal CK, and sequentially includes the first inverter 144, the second flip-flop 142 that operates in response to the inversed clock signal CK_N and the logic circuit 146. The circuit components in the pattern merger 140 are suitably configured such that the first delay path has about the same delay as the second delay path.

Specifically, in an embodiment, the logic circuit 146 includes a symmetry logic gate, such as a symmetry NAND gate, a symmetry NOR gate, a symmetry XOR gate, a symmetry XNOR gate, and the like, that has a substantially equal delay with respect to inputs. In an embodiment, the symmetry logic gate is specifically designed logic gate. It is noted that, in an example, the logic circuit 146 includes one or more inverters (not shown) to implement suitable logic.

Further, in the embodiment, the first flip-flop 141 and the second flip-flop 142 are configured to have about the same delay in response to clock signals. In an example, the first flip-flop 141 and the second flip-flop 142 are placed next to each other, and the geometry patterns of layers that form the first flip-flop 141 and the geometry patterns of the layers that form the second flip-flop 142 have the same shapes. Thus, in an example, the first flip-flop 141 and the second flip-flop 142 have about substantially equal delay in response to the clock signals under process, voltage and temperature variations.

In addition, in the embodiment, the first inverter 144 and the second inverter 145 are configured to have about the same delay. Further, in an example, wire connections are suitably placed and routed such that the total wire length on the first delay path is about the same as the total wire length on the second delay path.

According to an aspect of the disclosure, the first flip-flop 141 and the second flip-flop 142 respectively sample the positive pattern and the negative pattern based on the clock signal CK and the inversed clock signal CK_N, and the second inverter 145 compensates the delay due to the first inverter 144 that inverse the clock signal to generate the inversed clock signal CK_N, thus the synchrony of the first pattern P1 and the second pattern P2 are maintained, and the logic circuit 146 does not need to receive any clock signal as an input to generate the second clock signal CK_OUT.

The clock divider 105 operates similarly to the clock divider 104 described above. The clock divider 105 includes a pattern generator 160 and a pattern merger 170. The pattern generator 160 is similarly configured as the pattern generator 120, and the pattern merger 170 is similarly configured as the pattern merger 140. The description of these components has been provided above and will be omitted here for clarity purposes. It is noted that the pattern generator 160 can generate same patterns or different patterns from the patterns generated by the pattern generator 120, and the pattern merger 170 can use same logic circuit or different logic circuit to combine patterns.

Figure 2:
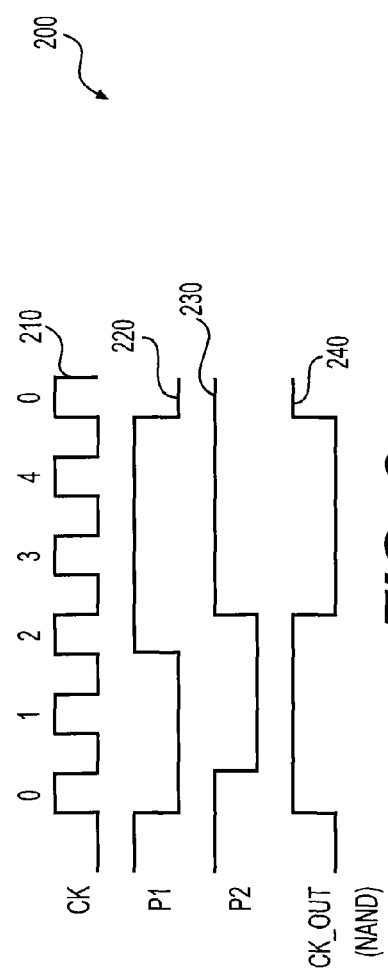
FIG. 2 shows a plot 200 of waveforms according to an embodiment of the disclosure.

FIG. 2 shows a plot 200 of waveforms of signals in the FIG. 1 example according to an embodiment of the disclosure. The plot includes a first waveform 210 for the clock signal CK, a second waveform 220 for the first pattern P1, a third waveform 230 for the second pattern P2, and a fourth waveform 240 for the second clock signal CK_OUT.

In the FIG. 2 example, the frequency divisor is five, and the first pattern P1 and the second pattern P2 are associated with the frequency divisor. The logic circuit 146 includes a NAND gate that uses NAND operation to combine the first pattern P1 with the second pattern P2 and generate the second clock signal CK_OUT. The frequency of the second clock signal CK_OUT is ⅕ of the clock signal CK's frequency. The second clock signal CK_OUT has 50% duty cycle. The logic circuit 146 does not need to receive the clock signal CK as an input to generate the second clock signal CK_OUT.

Figure 3:
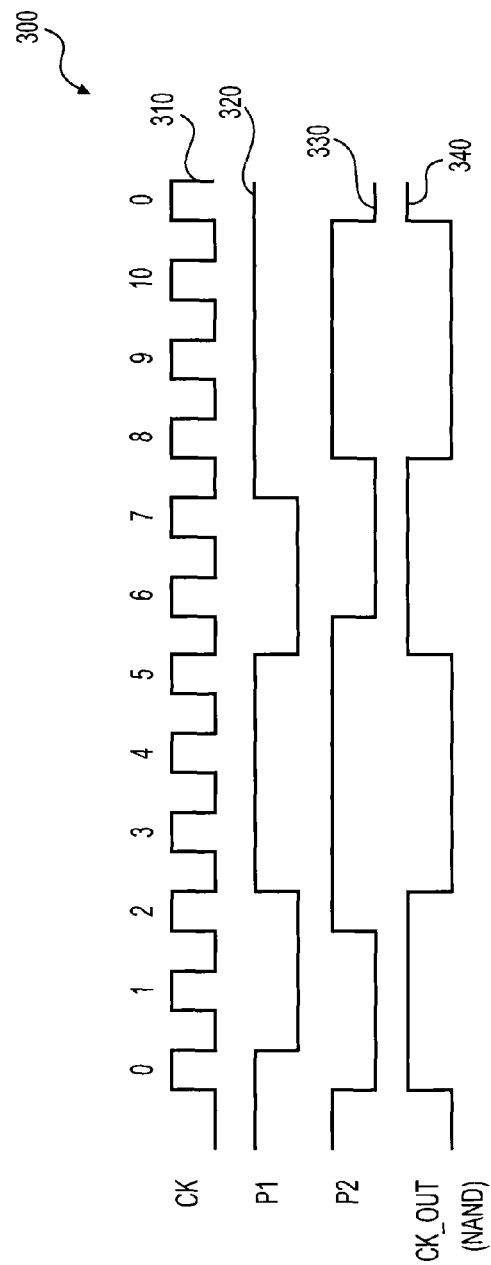
FIG. 3 shows a plot 300 of waveforms according to an embodiment of the disclosure.

FIG. 3 shows a plot 300 of waveforms of signals in the FIG. 1 example according to an embodiment of the disclosure. The plot includes a first waveform 310 for the clock signal CK, a second waveform 320 for the first pattern P1, a third waveform 330 for the second pattern P2, and a fourth waveform 340 for the second clock signal CK_OUT.

In the FIG. 3 example, the frequency divisor is five and a half (a half-integer), and the first pattern P1 and the second pattern P2 are associated with the frequency divisor. The logic circuit 146 includes a NAND gate that uses NAND operation to combine the first pattern P1 with the second pattern P2 and generate the second clock signal CK_OUT. The second clock signal CK_OUT has 45% duty cycle. The frequency of the second clock signal CK_OUT is ⅕.₅ of the clock signal CK's frequency. The logic circuit 146 does not need to receive the clock signal CK as an input to generate the second clock signal CK_OUT. It is noted that, when the half-integer is larger than five and a half, the clock divider 104 is able to generate the second clock signal CK_OUT with a duty cycle closer to 50%.

Figure 4:
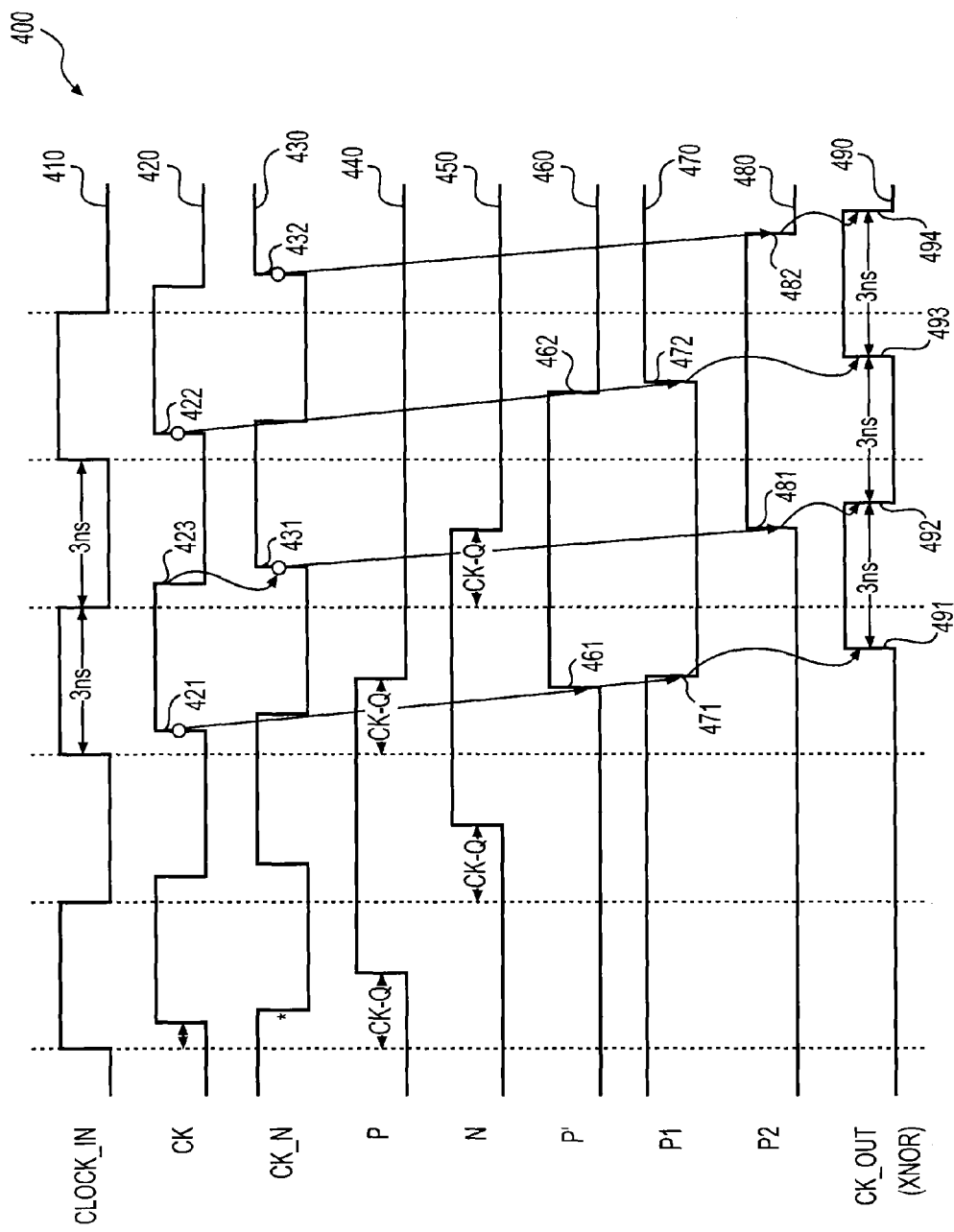
FIG. 4 shows a plot 400 of waveforms according to an embodiment of the disclosure.

FIG. 4 shows a plot 400 of waveforms of signals in the FIG. 1 example according to an embodiment of the disclosure. The plot includes a first waveform 410 for the input clock signal 135 of FIG. 1 (CLOCK_IN) input to the pattern merger 140, a second waveform 420 for the clock signal CK, a third waveform 430 for the inversed clock signal CK_N, a fourth waveform 440 for the positive pattern P input to the pattern merger 140, a fifth waveform 450 for the negative pattern N input to the pattern merger 140, a sixth waveform 460 for the buffered positive pattern P', a seventh waveform 470 for the first pattern P1, an eighth waveform 480 for the second pattern P2, and a ninth waveform 490 for the second clock signal CK_OUT. In the FIG. 4 example, the logic circuit 146 includes a XNOR gate that uses XNOR operation to combine the first pattern P1 with the second pattern P2 and generate the second clock signal CK_OUT. The logic circuit 146 does not need to receive a clock signal, such as the input clock signal 135, the clock signal CK, the inversed clock signal CK_N, and the like as an input to generate the second clock signal CK_OUT.

In the FIG. 1 example, the pattern merger 140 includes the first delay path and the second delay path to propagate transitions from the clock signal CK to the second clock signal CK_OUT. For example, on the first delay path, in response to a rising edge 421 of the clock signal CK, the first flip-flop 141 samples the positive pattern P, and outputs the buffered clock signal P' having a transition 461 with a first delay to the rising edge 421. In response to the transition 461, the second inverter 145 outputs the first pattern P1 having a transition 471 with a second delay to the transition 461. The transition 471 then causes a transition 491 in the second clock signal CK_OUT. The transition 491 has a third delay to the transition 471.

In the example, on the second delay path, in response to a falling edge 423 of the clock signal CK, the first inverter 144 outputs the inversed clock signal CK_N having a rising edge 431 with a fourth delay to the falling edge 423. In response to the rising edge 431 of the inversed clock signal CK_N, the second flip-flop 142 samples the negative pattern N and outputs the second pattern P2 having a transition 481 with a fifth delay to the rising edge 431. The transition 481 then causes a transition 492 in the second clock signal CK_OUT. The transition 492 has a sixth delay to the transition 481. In the example, the first delay path has a first sum delay of the first delay, the second delay and the third delay, and the second delay path has a second sum delay of the fourth delay, the fifth delay and the sixth delay.

In an embodiment, the circuitry is configured so that transitions are propagated with substantially the same delay on the first delay path and the second delay path. For example, the logic circuit 146 includes a symmetry XNOR gate with substantially equal delay to inputs to combine the first pattern P1 and second pattern P2, thus the third delay between the transition 491 and the transition 471 is about the same as the sixth delay between the transition 492 and the transition 481. Further, in the embodiment, the first flip-flop 141 and the second flip-flop 142 are configured to have about the same delay in response to clock signals, thus the first delay between the rising edge 421 and the transition 461 is about the same as the fifth delay between the rising edge 431 and the transition 481.

In addition, in the embodiment, the first inverter 144 and the second inverter 145 are configured to have substantially the same delay. Thus, with such circuitry the second delay between the transition 461 to the transition 471 is substantially the same as the fourth delay between the falling edge 423 and the rising edge 431, in an embodiment. Thus, in an embodiment, the first sum delay on the first delay path is substantially the same as the second sum delay on the second delay path. According to an aspect of the disclosure, due to the feature of the substantially equal delays on the first delay path and the second delay path, the pattern merger 140 introduces no jitter or reduced jitter in the second clock signal CK_OUT, thus the clock divider 104 is suitable to frequency-divide relatively high frequency clock signal, such as above 300 MHz, and the like to generate relatively balanced clock.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A circuit, comprising:
a logic circuit configured to operate without inputs from a first clock signal, the logic circuit being further configured to frequency-divide the first clock signal to generate a second clock signal based on a logic combination of a first pattern provided by a first circuitry including a first sampling flip-flop driven by the first clock signal, and a second pattern provided by a second circuitry including a second sampling flip-flop driven by an inversed first clock signal, the first sampling flip-flop and the second sampling flip-flop having a substantially equal delay in response input clocks; and
a first inverter configured to inverse the first clock signal to generate the inversed first clock signal, a delay of the first inverter being compensated by a second inverter of the first circuitry.

2. The circuit of claim 1, wherein the first sampling flip-flop is configured to drive the first pattern in response to rising edges of the first clock signal and the second sampling flip-flop is configured to drive the second pattern in response to falling edges of the clock signal.

3. The circuit of claim 1, wherein the logic circuit includes a logic gate to provide the second clock signal with a substantially equal delay in response to the first pattern and the second pattern.

4. The circuit of claim 3, wherein the logic circuit includes at least one of a NAND gate, a NOR gate, a XOR gate, a XNOR gate.

5. A method for clock generation, comprising:
receiving a first pattern provided by a first circuitry driven by a first clock signal;
receiving a second pattern provided by a second circuitry driven by the first clock signal;
logic-combining, using a logic circuit that is configured to operate without receiving an input from the first clock signal, the first pattern and the second pattern to frequency-divide the first clock signal to generate a second clock signal;
providing the first clock signal to a first sampling flip-flop in the first circuitry;
providing an inversed first clock signal to a second sampling flip-flop in the second circuitry, the second sampling flip-flop having a substantially equal delay in response to input clocks as the first sampling flip-flop;
inversing, by a first inverter, the first clock signal to generate the inversed first clock signal; and
compensating, using a second inverter in the first circuitry, a delay of the first inverter.

6. The method of claim 5, further comprising:
driving the first pattern in response to rising edges of the first clock signal; and
driving the second pattern in response to falling edges of the first clock signal.

7. The method of claim 5, wherein logic-combining, using the logic circuit, the first pattern and the second pattern to frequency-divide the first clock signal comprises:
outputting the second clock signal using a logic gate with a substantially equal delay in response to the first pattern and the second pattern and without receiving the input from the first clock signal.

8. The method of claim 7, wherein outputting the second clock signal using the logic gate with the substantially equal delay in response to the first pattern and the second pattern and without receiving the input from the first clock signal comprises:
providing the output using at least one of a NAND gate, an NOR gate, a XOR gate and a XNOR gate with the substantially equal delay in response to the first pattern and the second pattern and without receiving the input from the first clock signal.

9. An integrated circuit (IC) chip, comprising:
a clock generator configured to generate a first clock signal; and
a clock divider comprising:
a first circuitry configured to drive a first pattern in response to the first clock signal, the first circuitry including a first sampling flip-flop driven by the first clock signal;
a second circuitry configured to drive a second pattern in response to the first clock signal, the second circuit including a second sampling flip-flop driven by an inversed first clock signal, the first sampling flip-flop and the second sampling flip-flop having a substantially equal delay in response input clocks;
a first inverter configured to inverse the first clock signal to generate the inversed first clock signal, a delay of the first inverter being compensated by a second inverter of the first circuitry; and
a logic circuit configured to operate without inputs from the first clock signal, and to frequency-divide the first clock signal to generate a second clock signal based on a logic combination of the first pattern and the second pattern.

10. The IC chip of claim 9, wherein the first sampling flip-flop is configured to drive the first pattern in response to rising edges of the first clock signal and the second sampling flip-flop is configured to drive the second pattern in response to falling edges of the clock signal.

11. The IC chip of claim 9, wherein the logic circuit includes at least one of a NAND gate, a NOR gate, a XOR and a XNOR gate to provide the second clock signal with a substantially equal delay in response to the first pattern and the second pattern.

12. A circuit, comprising:
a logic circuit configured to operate without inputs from a first clock signal, the logic circuit being further configured to frequency-divide the first clock signal to generate a second clock signal based on a logic combination of a first pattern provided by a first circuitry driven by the first clock signal, and a second pattern provided by a second circuitry driven by a signal that is acquired by an inversion of the first clock signal, the first circuitry being configured to compensate a delay caused by the inversion.

* * * * *